(12) United States Patent
Chan et al.

(10) Patent No.: US 7,304,514 B2
(45) Date of Patent: Dec. 4, 2007

(54) METHODS AND CIRCUITS FOR SENSING ON-CHIP VOLTAGE IN POWERUP MODE

(75) Inventors: Johnny Chan, Fremont, CA (US); Philip Ng, Cupertino, CA (US)

(73) Assignee: Atmel Corporation, San Jose, CA (US)

( * ) Notice: Subject to any disclaimer, the term of this patent is extended or adjusted under 35 U.S.C. 154(b) by 54 days.

(21) Appl. No.: 11/399,848

(22) Filed: Apr. 6, 2006

(65) Prior Publication Data

US 2007/0236259 A1    Oct. 11, 2007

(51) Int. Cl.
*H03L 7/00*    (2006.01)
(52) U.S. Cl. .................................... 327/143; 327/198
(58) Field of Classification Search ................. None
See application file for complete search history.

(56) References Cited

U.S. PATENT DOCUMENTS

| | | | |
|---|---|---|---|
| 5,111,376 A | 5/1992 | Mehl | |
| 5,534,771 A * | 7/1996 | Massie | ....................... 323/285 |
| 5,847,586 A | 12/1998 | Burstein | |
| 6,384,670 B1 | 5/2002 | Eager et al. | |
| 6,590,412 B2 | 7/2003 | Sunter | |
| 6,720,821 B2 * | 4/2004 | Ajit | ............................ 327/530 |
| 7,123,460 B2 * | 10/2006 | Ajit | ............................... 361/86 |
| 7,224,192 B2 * | 5/2007 | Fukushi et al. | ................ 327/77 |
| 2005/0104571 A1 * | 5/2005 | Byeon et al. | ............... 323/288 |
| 2005/0280450 A1 * | 12/2005 | Shin et al. | ................... 327/143 |

* cited by examiner

*Primary Examiner*—Cassandra Cox
(74) *Attorney, Agent, or Firm*—Sierra Patent Group, Ltd.

(57) ABSTRACT

A method for sensing voltage on an internal node in an integrated circuit includes applying a voltage larger than a threshold value to a first pad, generating from the activation voltage a potential for a sensing circuit and coupled to the internal node, and coupling an output of the sensing circuit to a second pad on the integrated circuit when the activation voltage is present on the first pad. A sensing circuit includes first and second pads, a voltage-sensor circuit having an input coupled to an internal node and a power connection coupled to a sensor power node. A circuit is configured to place a supply potential on the sensor power node when a threshold value is on the first pad. A switch coupled between the sensing circuit and the second pad turns on when the supply potential is on the voltage sensor power node.

11 Claims, 2 Drawing Sheets

METHODS AND CIRCUITS FOR SENSING ON-CHIP VOLTAGE IN POWERUP MODE

BACKGROUND OF THE INVENTION

1. Field of the Invention

The present invention relates to integrated circuit technology. More particularly, the present invention relates to on-chip circuitry for sensing an analog signal during powerup of an integrated circuit.

2. The Prior Art

There sometimes exists a need for sensing an analog signal present in an integrated circuit during powerup of the integrated circuit prior to a time at which the entire circuit is functioning. In some cases, an additional I/O pad may be provided to provide power for performing this function. However, as the complexity of the functions of the integrated circuit increases, integrated circuit I/O availability becomes more constrained and additional I/O to provide functionality such as application of external power supply potential may not be available.

BRIEF DESCRIPTION OF THE INVENTION

According to one aspect of the present invention, a method for sensing voltage on an internal node in an integrated circuit includes sensing that an activation voltage larger than a threshold value is present on a first I/O pad on the integrated circuit, generating from the activation voltage a power potential for a sensing circuit disposed on the integrated circuit and coupled to the internal node, and coupling an output of the sensing circuit to a second I/O pad on the integrated circuit only when the activation voltage is present on the first I/O pad. The first and second I/O pads may have other functions when sensing voltage on the internal node is not taking place.

According to a second aspect of the present invention, circuits for sensing voltage on an internal node in an integrated circuit are disclosed. In response to sensing the presence of an above-threshold voltage on a first I/O pad of the integrated circuit, a circuit generates a power potential therefrom and provides it to a voltage-sensing circuit. The circuit also couples the output of the voltage-sensing circuit to a second I/O pad on the integrated circuit.

In one embodiment, a circuit for sensing voltage on an internal node in an integrated circuit includes first and second I/O pads, and a voltage-sensor power node on the integrated circuit. A voltage-sensor circuit has an input coupled to the internal node and has a power connection coupled to the voltage-sensor power node. A circuit coupled to the first I/O pad and to the voltage sensor power node is configured to place a voltage-sensor power supply potential on the voltage sensor power node when a voltage larger than a threshold value is present on the first I/O pad. A switch is coupled between the output of the voltage-sensor circuit and the second I/O pad. A control element of the switch is coupled to the voltage-sensor power node and is configured to turn on the first switch when the voltage-sensor power supply potential is present on the voltage sensor power node. The first and second I/O pads may have other functions when the voltage-sensor circuit is not active.

BRIEF DESCRIPTION OF THE DRAWING FIGURES

DETAILED DESCRIPTION OF THE INVENTION

Persons of ordinary skill in the art will realize that the following description of the present invention is illustrative only and not in any way limiting. Other embodiments of the invention will readily suggest themselves to such skilled persons.

Figure 1:
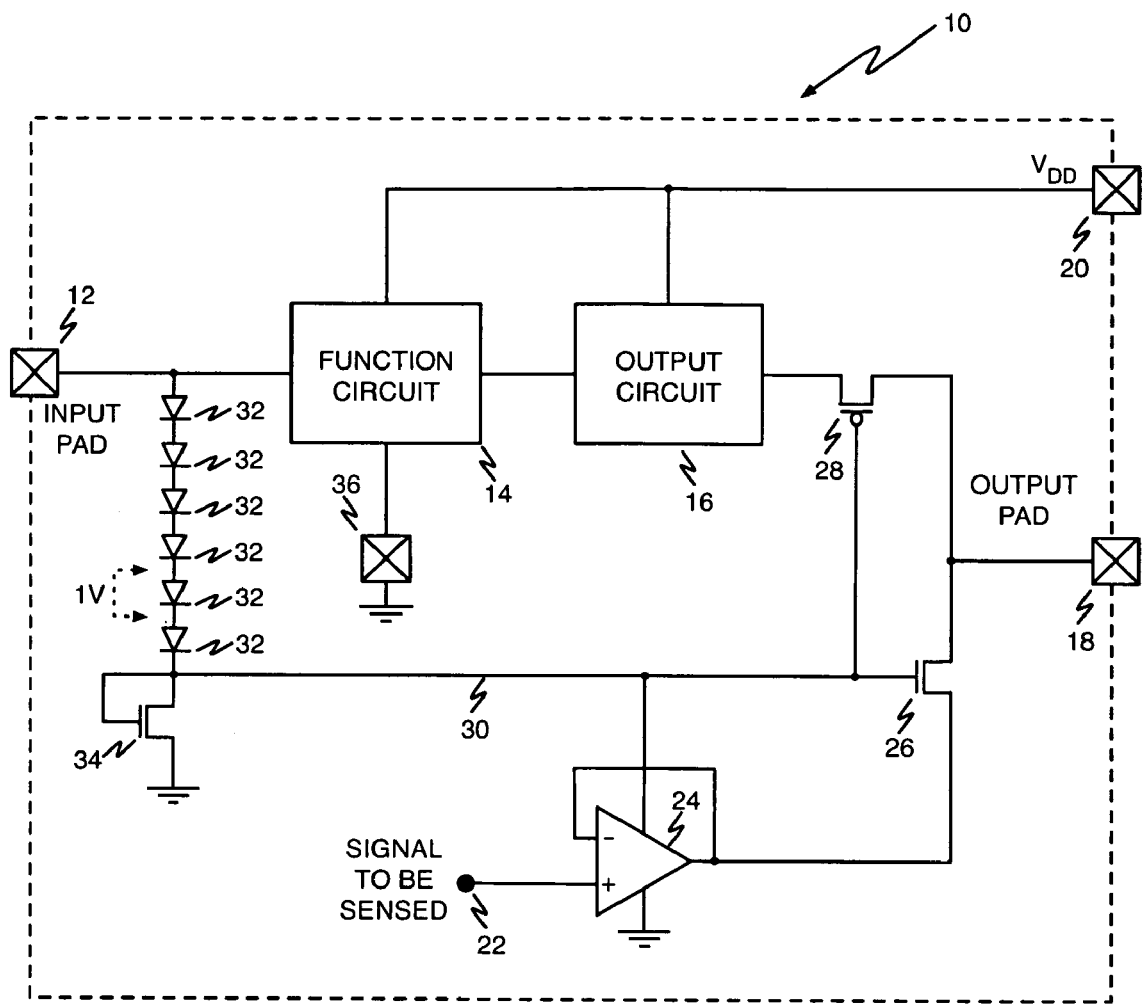
FIG. 1 is a schematic diagram of an illustrative embodiment of a circuit according to the principles of the present invention.

Referring first to FIG. 1, a schematic diagram shows an illustrative embodiment of a voltage sensing circuit according to the principles of the present invention. An integrated circuit 10 includes an input pad 12 coupled to a function circuit 14. Function circuit 14 may be any circuit and is shown to illustrate the present invention. Function circuit 14 is coupled to an output circuit 16 whose output is intended to be presented on output pad 18 during the normal operation of the integrated circuit 10. During normal operation of integrated circuit 10, power is supplied to the integrated circuit through $V_{DD}$ input pad 20.

Integrated circuit 10 also includes an internal signal node 22. It is desired to sense the voltage on internal signal node 22 at a time prior to completion of the powerup of the integrated circuit 10. At the time sensing is desired, presence of full operating voltages everywhere in the integrated circuit 10 cannot be assured. While, in some cases, it is possible to devote an I/O pad of the integrated circuit to the function of supplying a power-supply potential for powering a voltage-sensing circuit, in many cases it is not possible.

According to the present invention, I/O pad 12 may be used to temporarily supply a power-supply potential to use for powering a voltage-sensing circuit on the integrated circuit 10. Accordingly, a voltage-sensing circuit includes an operational amplifier 24 configured either as a voltage follower or a unity-gain operational amplifier with its output connected to its inverting input. The output of operational amplifier 24 mirrors the voltage at internal signal node 22 and is coupled to output pad 18 through n-channel MOS transistor 26. As may be seen from an examination of FIG. 1, the output of output circuit 16 is coupled to output pad 18 through p-channel MOS transistor 28. The gates of n-channel MOS transistor 26 and p-channel MOS transistor 28 are coupled together to a power-supply line $AV_{DD}$ indicated at reference numeral 30. Power for operational amplifier 24 is supplied by power-supply line 30.

A series string of diodes 32 in series with a weak depletion-mode n-channel MOS transistor 34 are coupled between I/O pad 12 and ground. Each diode may be configured from a diode-connected MOS transistor and each diode drops about 1V as indicated in FIG. 1. The depletion mode transistor has a $V_t$ of about 0V. As will be appreciated by persons of ordinary skill in the art, the $AV_{DD}$ line 30 will be at zero volts when the voltage at the input pad 12 is less than 6V. This condition is encountered during normal operation of the integrated circuit 10, during which time the voltage at the input pad 12 will be considerably less than 6V. Under this condition, the n-channel MOS transistor 26 will be turned off and the p-channel MOS transistor 28 will be turned on, connecting the output of output circuit 16 to the output pad 18 and turning off operational amplifier 24 as well as disconnecting its output from output pad 18.

When it is desired to operate the voltage sensing circuit of the present invention, a voltage having a magnitude greater than 6V, e.g., 8V, is placed on input pin 12. Under that condition, the $AV_{DD}$ line 30 will be at about 2V. Under this condition, the n-channel MOS transistor 26 will be turned on and the p-channel MOS transistor 28 will be turned off, disconnecting the output of output circuit 16 from the output pad 18, and turning on operational amplifier 24 as well as connecting its output to output pad 18. The signal appearing at internal signal node 22 will thus be buffered by operational amplifier 24 and presented on output pad 18. All signals may be referenced to ground at I/O pad 34.

Figure 2:
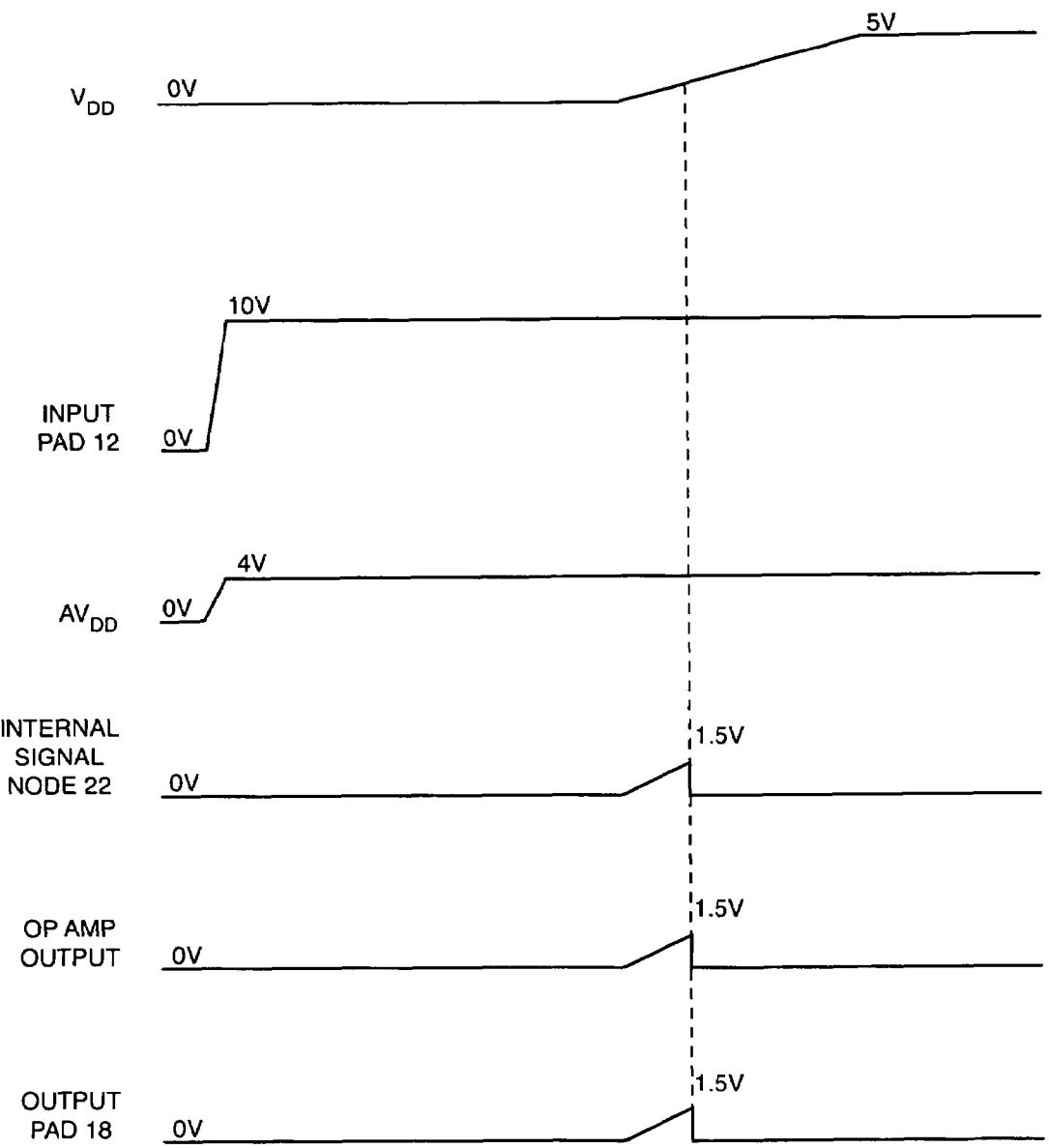
FIG. 2 is a diagram showing the voltages at various circuit nodes in the integrated circuit as a function of time.

Referring now to FIG. 2, a diagram shows the voltages at the input pad 12, the $V_{DD}$ input pad 20, the internal signal node 22, the $AV_{DD}$ line 30, and the output pad 18 as a function of time. The first trace represents the voltage at the $V_{DD}$ input pad 20, the second trace represents the voltage at the input pad 12, the third trace represents the voltage at the $AV_{DD}$ line 30, the fourth trace represents the voltage at internal signal node 22, the fifth trace represents the voltage at the output of operational amplifier 24 which mirrors the voltage at internal signal node 22, and the sixth trace represents the voltage at the output pad 18. From FIG. 2 it may be seen that the voltage at the internal node 22 is sensed while the voltage at the $V_{DD}$ node has not yet risen to its nominal value.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A circuit for sensing voltage on an internal node in an integrated circuit including:
   a first I/O pad on the integrated circuit;
   a second I/O pad on the integrated circuit;
   a voltage-sensor power node;
   a voltage-sensor circuit having an input coupled to the internal node and having a power connection coupled to the voltage-sensor power node, the voltage-sensor circuit also having an output;
   a power-supplying circuit coupled to the first I/O pad and to the voltage sensor power node, the power-supplying circuit configured to place a voltage-sensor power supply potential on the voltage sensor power node when a voltage larger than a threshold value is present on the first I/O pad; and
   a first switch coupled between the output of the voltage-sensor circuit and the second I/O pad, the first switch having a control element coupled to the voltage-sensor power node and configured to turn on the first switch when the voltage-sensor power supply potential is present on the voltage sensor power node.

2. The circuit of claim 1 wherein the power supplying circuit includes:
   a series string of diodes coupled between the first I/O pad and the voltage sensor power node; and
   a weak depletion mode n-channel MOS transistor coupled between the voltage sensor power node and ground.

3. The circuit of claim 2 wherein:
   the series string of diodes includes six diodes; and
   the voltage-sensor power supply potential is greater than six volts.

4. The circuit of claim 1 wherein the first switch comprises an n-channel MOS transistor having a first source/drain terminal coupled to the output of the voltage-sensor circuit, a second source/drain terminal coupled to the second I/O pad, and a gate coupled to the voltage sensor power node.

5. The circuit of claim 1, further including:
   a functional circuit disposed on the integrated circuit and having an input coupled to the first I/O pad and an output;
   a second switch coupled between the output of the functional circuit and the second I/O pad, the second switch having a control element coupled to the voltage-sensor power node and configured to turn on the second switch when the voltage-sensor power supply potential is present on the voltage sensor power node.

6. The circuit of claim 5 wherein the power supplying circuit includes:
   a series string of diodes coupled between the first I/O pad and the voltage sensor power node; and
   a weak depletion mode n-channel MOS transistor coupled between the voltage sensor power node and ground.

7. The circuit of claim 5 wherein the second switch comprises a p-channel MOS transistor having a first source/drain terminal coupled to the output of the voltage-sensor circuit, a second source/drain terminal coupled to the second I/O pad, and a gate coupled to the voltage sensor power node.

8. A method for sensing voltage on an internal node in an integrated circuit including:
   providing an activation voltage larger than a threshold value on a first I/O pad on the integrated circuit;
   generating from the activation voltage a power potential for a sensing circuit disposed on the integrated circuit and coupled to the internal node; and
   coupling an output of the sensing circuit to a second I/O pad on the integrated circuit only when the activation voltage is present on the first I/O pad.

9. The method of claim 8 wherein coupling the output of the sensing circuit to the second I/O pad includes turning on an n-channel MOS transistor coupled between the output of the sensing circuit and the second I/O pad.

10. The method of claim 8, further including disconnecting the output of a function circuit in the integrated circuit from the second I/O pad while the output of the sensing circuit is coupled to the second I/O pad.

11. The method of claim 10, wherein disconnecting the output of the function circuit in the integrated circuit from the second I/O pad includes turning off a p-channel MOS transistor coupled between the output of the function circuit and the second I/O pad.

* * * * *